(12) United States Patent
Pennock

(10) Patent No.: US 8,581,356 B2
(45) Date of Patent: Nov. 12, 2013

(54) SEMICONDUCTOR STRUCTURES FOR BIASING DEVICES

(75) Inventor: John Laurence Pennock, Midlothian (GB)

(73) Assignee: Wolfson Microelectronics plc, Edinburgh (GB)

( * ) Notice: Subject to any disclaimer, the term of this patent is extended or adjusted under 35 U.S.C. 154(b) by 355 days.

(21) Appl. No.: 12/649,541

(22) Filed: Dec. 30, 2009

(65) Prior Publication Data

US 2010/0164068 A1 Jul. 1, 2010

(30) Foreign Application Priority Data

Dec. 30, 2008 (GB) .................................... 0823651.5

(51) Int. Cl.
*H01L 29/84* (2006.01)

(52) U.S. Cl.
USPC .................... 257/415; 438/382; 257/E29.326; 381/114

(58) Field of Classification Search
USPC ........... 257/415, E29.326; 438/382; 381/111, 381/114

See application file for complete search history.

(56) References Cited

U.S. PATENT DOCUMENTS

| | | | |
|---|---|---|---|
| 5,136,348 A | 8/1992 | Tsuzuki et al. | |
| 5,313,087 A | 5/1994 | Chan et al. | |
| 5,330,933 A | 7/1994 | Chan et al. | |
| 5,502,338 A | 3/1996 | Suda et al. | |
| 6,060,752 A | 5/2000 | Williams | |
| 6,091,274 A * | 7/2000 | Preslar .......................... | 327/326 |
| 2006/0071276 A1 | 4/2006 | Zundel et al. | |

FOREIGN PATENT DOCUMENTS

| | | |
|---|---|---|
| GB | 1483169 A | 8/1977 |
| WO | WO-97/15081 A1 | 4/1997 |
| WO | WO-03/078301 A2 | 9/2003 |

* cited by examiner

*Primary Examiner* — Shaun Campbell
(74) *Attorney, Agent, or Firm* — Dickstein Shapiro LLP

(57) ABSTRACT

Semiconductor structures with high impedances for use in biasing for applying voltage bias to part of a device. The semiconductor structure comprises a continuous structure having a plurality of regions of a first semiconductor type (n type or p type) material arranged alternately with at least one region of the opposite type. The structure may be formed from polysilicon and may also include a plurality of intrinsic regions arranged between the n and p type regions. The structure forms a composite diode and provides a high impedance.

34 Claims, 16 Drawing Sheets

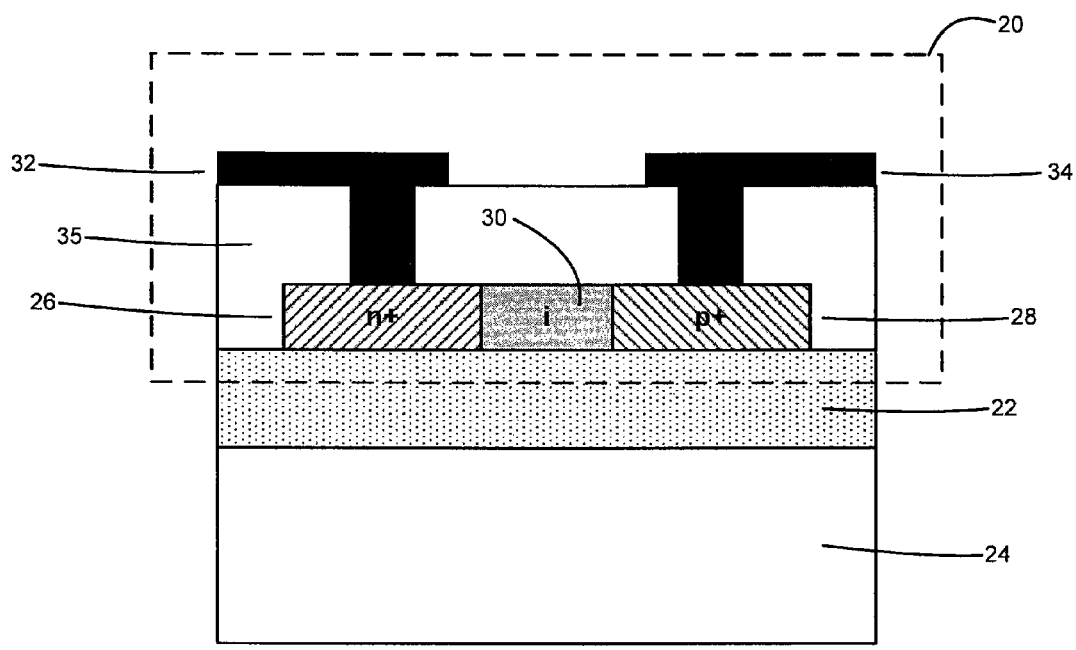
Figure 2a    PRIOR ART
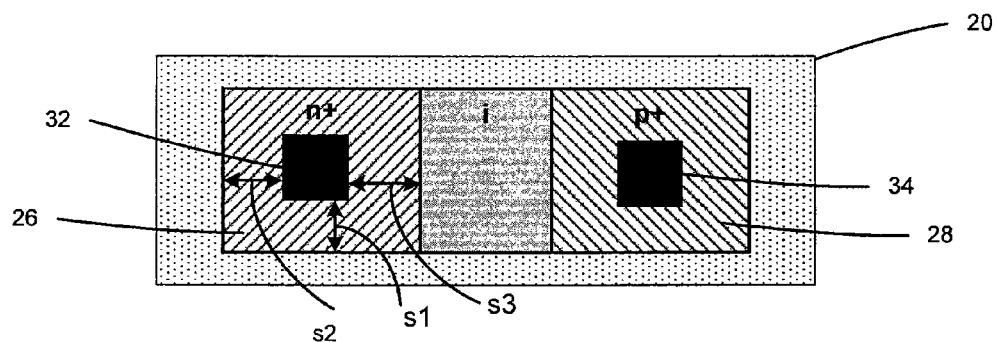
Figure 2b    PRIOR ART

SEMICONDUCTOR STRUCTURES FOR BIASING DEVICES

BACKGROUND OF THE INVENTION

1. Field of the Invention:

The present invention relates to semiconductor structures for realising very high impedances for use in biasing devices, and in particular, but not exclusively, to semiconductor structures having high impedances for use in biasing high impedance loads such as capacitors, for example capacitive transducers such as MEMS microphones.

2. Description of the Related Art:

Consumer electronics devices are continually getting smaller and, with advances in technology, are gaining ever increasing performance and functionality. This is clearly evident in the technology used in consumer electronic products such as mobile phones, laptop computers, MP3 players and personal digital assistants (PDAs). Requirements of the mobile phone industry for example, are driving the components to become smaller with higher functionality and reduced cost. For example, some mobile phones now require multiple microphones for noise cancelling, or accelerometers to allow inertial navigation, while maintaining or reducing the small form factor and aiming at a similar total cost to previous generation phones.

This has encouraged the emergence of miniature transducers, initially electret microphones, more recently micro-electrical-mechanical systems (MEMS) based devices. These may be, for example, pressure sensors, ultrasonic transducers, accelerometers, and microphones. Many of these devices are capacitive transducers, comprising one or more membranes with electrodes for read-out/drive deposited on the membranes and/or a substrate. Relative movement of these electrodes modulates the capacitance between them, which then has to be detected by sensitive electronic amplifiers.

However, the miniature size of these transducers leads to very low capacitance values, of the order of 1 pf, for these transducers. This leads to a requirement for extremely high resistance values, of the order of Gigaohms (GΩ) or Teraohms (TΩ), for elements biasing the transducer if meaningful signals are to be sensed.

FIG. 1a shows a typical transducer circuit to illustrate this problem. A MEMS microphone transducer 10 comprises a capacitor 12 which is arranged, for example, to respond to incident audio pressure waves. The pressures waves displace at least one plate of the capacitor, and the resultant signal is received and amplified by an amplifier 14.

The top plate 7 of the capacitor 12 is biased by a fixed and clean voltage supply, Vbias 11, to say +12V for example. The bottom plate 9 of the MEMS capacitor 12 is biased with a lower d.c. voltage, say 0V for example, through a resistor 13 of resistance value R. However, at audio frequencies, looking into the amplifier and resistor 13, the capacitor 12 needs to see an impedance that is much greater than its own reactance at those audio frequencies, in order to avoid attenuation of the signal. In detail, the acoustically sourced audio signal can be modelled, as shown, as an a.c. voltage source 15 in series with the supply 11 and the MEMS capacitor 10. The amplifier input (and output) will exhibit a first-order high-pass filter response, with a −3 dB point at a corner frequency $1/(2.\pi.R.C)$. Thus, for a 20 Hz corner frequency, given a capacitor 12 of capacitance 1 pF, then a resistor 13 having a resistance R of 8 Gohm is required.

Preferably, the corner frequency is somewhat lower than 20 Hz so as to allow the thermal noise voltage density of such a high value resistor 13 to be attenuated by the low-pass filtering effect of itself and the capacitor 12. Again, for a capacitor 12 of capacitance 1 pF, a 0.1 Hz corner frequency is achieved by having a resistor 13 that has a resistance R of 160 Gohm which is required to reduce the noise contribution to 45 μV to 11.4 μV over 20 Hz to 20 kHz or from 11.7 to 2.6 μV of noise when A-weighted, as customary for audio noise measurements.

Such a high resistance, i.e. 8 Gohm or even 160 Gohm, is difficult to achieve in practice, especially on an integrated circuit. For example, assume designing a resistor having a resistance of 1 kohm/square which is to be laid out such that it has a width of 1 μm and 1 μm space between adjacent resistor strips, even an 8 Gohm resistor would require 16 mm² of silicon area, compared to typical integrated transducers and amplifiers which are less than 1 mm².

Various solutions have been proposed for implementation of this high impedance biasing function. FIG. 1b illustrates one solution. The resistor 13 of FIG. 1a is replaced by a pair of diodes 16, 18 connected in parallel and in opposite directions to one another. The diodes 16, 18 cooperate to provide a substantial resistance in order to bias the "low side" 9 of capacitor 12. For normal p-n silicon diodes, the slope resistance around zero volts is derived from the standard ideal diode equation to be (mkT/q)/Is, where "Is" is the junction saturation current of the diode and "m" is an empirical constant, approximately unity. Unfortunately, the diodes 16, 18 need to be very small in order to have a low enough capacitance relative to the sensor 10 capacitance so as not to attenuate the signal. Therefore, the saturation current of each of the diodes 16, 18 is usually of the order of 1 attoamp (aA), giving an equivalent resistance for the parallel combination in excess of $10^{16}$ ohms. So even for a capacitor 12 of 1 pf capacitance, this gives a time constant of over one hour. Thus, the time taken for the circuitry to settle out completely after start-up or some transient overload condition would be of this order. Also, even a femtoamp (fA) of leakage or photocurrent (or displacement current in the capacitor after some transient, such the pressure wave encountered by, for example, a door slamming in the near vicinity of the capacitive transducer 10) would give a shift of hundreds of millivolts (mV) at the input to the amplifier 14, which may saturate the amplifier 14 or following circuitry (not illustrated).

One known improvement is to use diodes based on junctions in a layer of polysilicon deposited on the field oxide of a silicon integrated circuit. FIG. 2a shows a known structure of such a polysilicon diode element 20 (referred to hereinafter as a "poly diode").

The poly diode element 20 is disposed on a silicon dioxide layer 22, previously disposed on a silicon substrate 24. The poly diode element 20 itself comprises an n-type region 26 forming a p-n junction with a p-type region 28. If the n-type and p-type polysilicon regions are touching, low reverse breakdown voltages and/or high leakage of current are observed, as the n- and p-type regions 26, 28 are polycrystalline, creating effects at the grain boundaries. These disadvantages are mitigated by interposing an intervening drift region 30 of substantially intrinsic semiconductor material.

The n-type region 26 is electrically connected to an electrode 32, and the p-type region 28 is electrically connected to another electrode 34 through contact holes etched in an overlying insulating dielectric layer 35.

Typically this structure will be manufactured by first depositing a layer of intrinsic material, etching away superfluous material to leave a polysilicon region for the whole diode, then selectively implanting or diffusing n or p dopant on the respective portions of this intrinsic material. The insulating layer 35 is then deposited, and holes etched into it to accommodate the vertical elements of the metal electrodes 32, 34 which are then deposited to fill the holes and in patterns on the surface to connect with other circuit elements (not illustrated).

FIG. 2b shows a plan view of the poly diode element 20, showing the first and second electrodes 32, 34 contacting the poly diode.

Design rules imposed by semiconductor manufacturers place constraints on the size and positioning of the electrical contacts. For example, minimum dimensions are imposed on the size of the contact holes and between the edge of the contact hole of an electrode 32, 34 and the edge of the polysilicon element 20 and from the intrinsic polysilicon region as illustrated by labels s1, s2, s3. Such constraints are imposed to allow some degree of tolerance during placement of the photographic masks used to define electrodes 32, 34 and the tolerances of the process steps that etch the holes for their contacts.

A disadvantage of using a poly diode 20 in a high impedance biasing circuit for a capacitive transducer is that the saturation currents for the smallest poly diodes capable of being manufactured today are about 1 picoAmp (pA). The factor "m", referred to above, is typically 2 rather than unity, but this still gives a zero-bias equivalent resistance (mkT/q)/Is of only 50 G$\Omega$ each, or 25 G$\Omega$ for their anti-parallel combination, which is still not quite high enough to filter out noise adequately, as described above.

It is therefore an aim of the present invention to provide a semiconductor structure for realising a high impedance which mitigates at least some of the above mentioned disadvantages.

SUMMARY OF THE INVENTION

According to a first aspect of the present invention, there is provided a device comprising a MEMS transducer and a biasing means for applying a voltage bias to said MEMS transducer wherein the biasing means comprises a semiconductor structure comprising: a continuous structure of semiconducting material comprising a plurality of regions of first semiconductor type, being n type or p type, and a plurality of regions of a second semiconductor type, being n type or p type and the opposite type to the first type, the regions of first semiconductor type and second semiconductor type being arranged alternately.

The present invention thus relates to a device having a biasing means, i.e. a means for maintaining part of the device at a particular voltage and/or charge level. The device may be a complete device or it may be a component which can form part of a larger device.

The biasing means comprises a continuous structure of semiconductor material arranged with a plurality of regions of one semiconductor type, either n type or p type. The device also has at least one region, and preferably a plurality of regions, of a second semiconductor type, the second type being of opposite semiconductor type to the first type, i.e. if the first semiconductor type is p type then the second type is n type and vice versa. The regions of first semiconductor type and second semiconductor type are arranged alternately, that is, generally the order will be npn . . . or pnp . . . .

The semiconductor device is conveniently arranged as a two terminal device, i.e. the continuous structure of semiconductor material is electrically connected to the device via two terminals. Thus the semiconductor device is a diode and should not be confused with three terminal devices such as transistors. As will be described in more detail later however the term diode does not necessarily imply that the structure has clear forward and reverse biasing directions and some embodiments have symmetrical dc responses.

It will be appreciated that the semiconductor structure is a multiple junction device with at least one np junction and at least one pn junction electrically connected in series. Each pn or np junction acts as a junction diode and hence the semiconductor structure can be seen as a composite diode which is effectively equivalent to a plurality of diodes connected in series. The semiconductor structure may therefore be referred to as a diode or composite diode.

In some embodiments, a direct contact between the p type and n type regions is not preferred. For example, as will be described later, the continuous semiconductor structure may be formed from polysilicon. In this instance it may be preferred to have the n and p type regions separated by a region which is substantially intrinsic. The intrinsic region may comprise intrinsic material or, as the skilled person will be aware, lightly doped n type or p type material could also be used. Conveniently therefore the continuous structure further comprises a plurality of regions of a third semiconductor type, said third semiconductor type being one or more of substantially intrinsic, lightly doped p-type or lightly doped n-type, arranged between respective regions of first semiconductor type and regions of second semiconductor type. It will be understood that the regions of first and second semiconductor types are regions with p type or n type semiconductor properties and may be relatively highly doped. In terms of semiconductor nomenclature such regions may, for example, be p or p$^+$ regions or n or n$^+$ regions. The regions of third semiconductor type behave as substantially intrinsic regions. Such regions may therefore be i regions or p$^-$ or n$^-$ regions. For convenience however such regions will be referred to throughout this specification as intrinsic regions.

For the avoidance of doubt, it will be noted that if the intrinsic regions do comprise lightly doped regions, say of p$^-$ material, then the structure will contain a p type region adjacent a p$^-$ region. For example the semiconductor structure may be p$^+$p$^-$n$^+$p$^-$p$^+$. . . . It will be appreciated however that the regions of first semiconductor type, p$^+$ in this example, are arranged alternately with the regions of second semiconductor type, n$^+$, with regions of third semiconductor type between them. The third semiconductor type is different to the first and second semiconductor types.

As will be described in more detail later the width of the intrinsic regions is chosen to ensure good operating characteristics. The width of the regions of third semiconductor type is therefore conveniently within the range of 0.2 to 5 microns inclusive.

The semiconductor structure of the present invention may have a saturation current in the range of 10 fA to 100 pA or in the range 0.2-5.0 pA. It will be appreciate that such a saturation current is significantly greater than conventional silicon pn junction diodes.

The device may preferably have a plurality of regions of second semiconductor type.

The number of regions of first and second semiconductor types may be chosen according to the desired device properties for a particular application. In some instances there may be an even number of regions of the first semiconductor type and an odd number or regions of the second semiconductor type. Such an arrangement gives symmetrical dc characteristics as will be described later.

As mentioned above the semiconductor structure is arranged as a diode, i.e. a two terminal device. The terminals may be provided with electrodes and hence the device may comprise an electrode connected to a first end of the continuous structure and an electrode connected to a second end of the continuous structure.

When electrodes are present the regions of the first or second semiconductor type at the ends of the continuous structure may be larger in size than any regions of the first or second conductor type between the ends of the continuous structure. Minimizing the size of the middle regions of n or p type reduces parasitic capacitance as will be described later.

Conveniently the continuous structure is formed laterally on a substrate. The substrate may comprise a semiconductor substrate and at least one insulating layer, the continuous structure being formed on the insulating layer. The substrate may also comprise other additional layers but the semiconductor structure is formed on the uppermost layer which should be insulating. To reduce parasitic capacitance between the substrate and the semiconductor structure, a conductive layer may be formed under the continuous structure in the semiconductor substrate. The conducting layer may be a well of n-type or p-type semiconductor. If the substrate is generally p type then the conducting layer will be a well of n-type material. The well may be electrically connected to one end of the continuous structure.

The semiconducting material of the continuous structure may be silicon, and conveniently be polysilicon. A semiconductor structure as described formed from polysilicon provides a high impedance composite diode structure which is particularly useful for biasing loads such as capacitive loads. The device can be designed to have a required impedance and a relatively high saturation current so allowing current flow.

To achieve particular impedances or other electrical characteristics a plurality of semiconductor structures may be connected together, for instance at least two such semiconductor structures may be electrically connected in series. Each of the semiconductor structures, or composite diodes, connected in series may be identical or they may vary in the number or arrangement of regions of first and second semiconductor type. For instance one said semiconductor structure may have a different number of regions of the first and second semiconductor type to another.

At least two such semiconductor structures may be electrically connected in parallel. In order to provide symmetric characteristics the semiconductor structures may be connected in parallel and in opposite, in other words first and second semiconductor structures may be connected in parallel such that at each end of the parallel connection the first semiconductor structure has a region of the opposite semiconductor type to the second semiconductor structure.

The continuous structure may be straight, curved, or formed into a circular configuration.

As mentioned above the device can be used in a variety of application. The device may comprise a transducer. The transducer may comprise a first capacitive plate; a second capacitive plate; and the biasing means may be arranged to bias the second capacitive plate with respect to the first capacitive plate, for instance by the semiconductor structure being electrically connected between the second capacitive plate and a reference voltage level. The device may additionally or alternatively comprise an amplifier for amplifying an electrical output of the transducer and the biasing means is arranged to bias the amplifier. The device may be a MEMS device and may be used in a variety of applications such as an ultrasound imager, a sonar transmitter and/or receiver, a personal desktop assistant, an MP3 player or other music or audio playing device or a laptop computer.

In another aspect of the invention there is provide a high impedance device comprising a semiconductor structure, said semiconductor structure comprising a continuous structure of semiconducting material comprising a plurality of regions of first semiconductor type, being n type or p type, and at least one region, and preferably a plurality of regions, of a second semiconductor type, being n type or p type and the opposite type to the first type, the regions of first semiconductor type and second semiconductor type being arranged alternately.

The semiconductor structure of this aspect of the invention has all of the same advantages and variants as described above in relation to the first aspect of the invention. In particular the regions of the first or second semiconductor type at the ends of the continuous structure may be larger in size than any regions of the first or second conductor type between the ends of the continuous structure and the semiconductor structure may comprise an electrode connected to a first end of the device and/or an electrode connected to a second end of the device. The structure may also comprise regions of a third semiconductor type, being one or more of substantially intrinsic, lightly doped p type or lightly doped n type, arranged between respective regions of first semiconductor type and regions of second semiconductor type as described above. The width of the regions of third semiconductor type is conveniently within the range of 0.2 to 5 microns inclusive. The structure may also comprise a plurality of regions of the second semiconductor type.

Such a high impedance device may have a saturation current in the range of 10 fA to 100 pA inclusive or in the range 0.2-5 pA inclusive.

The semiconductor structure may have an even number of regions of the first semiconductor type and an odd number or regions of the second semiconductor type.

The high impedance device according to this aspect of the invention may be arranged such that the parasitic capacitance arising from the semiconductor structure in use is less in the middle of the semiconductor structure than at the ends.

The high impedance device may be arranged to be electrically connected to a capacitive load.

In another aspect of the invention there is provided a method of biasing a MEMS transducer comprising the steps of arranging a high impedance element between the MEMS transducer and a reference voltage level wherein said high impedance element comprises a semiconductor structure comprising: a continuous structure of semiconducting material comprising a plurality of regions of first semiconductor type, being n type or p type, and at least one region of a second semiconductor type, being n type or p type and the opposite type to the first type, the regions of first semiconductor type and second semiconductor type being arranged alternately. The device may comprise a transducer having a first capacitive plate and a second capacitive plate and the method may involve electrically connecting said composite diode between said second capacitive plate and the reference voltage level. The transducer may be a MEMS transducer.

In a yet further aspect of the invention there is provided a method of fabricating a high impedance device comprising the steps of: depositing a layer of semiconductor material onto a substrate; and forming, in said layer of semiconductor material, a plurality of regions of a first semiconductor type, being n-type or p-type, and also forming at least one region, and preferably a plurality of regions, of a second semiconductor type, being n-type or p-type and of opposite type to the first semiconductor regions, said first and second regions being arranged alternately.

The method of this aspect of the invention may further comprise the step of forming a plurality of regions of third semiconductor type, said third semiconductor type being one or more of substantially intrinsic, lightly doped p type or lightly doped n type semiconductor material, said regions of third semiconductor type being disposed between said regions of first semiconductor type and regions of second semiconductor type.

The regions of a first semiconductor type may be formed by implanting or diffusing said regions with a first dopant type and the regions of a second semiconductor type are formed by implanting or diffusing said regions with a second dopant type. The regions of third semiconductor type are formed by regions of said layer of semiconductor material without any dopant and may be formed having a width in the range of 0.2 to 5 microns inclusive. The semiconductor material may be polysilicon.

The method may be arranged to form any regions of first or second conductor type between the ends of said layer of semiconductor material as smaller regions than the regions of first or second semiconductor type at the ends of the semiconductor layer.

The method may comprise forming an even number of said regions of first semiconductor type and the step of forming said regions of a second semiconductor type comprises forming an odd number of said regions of second semiconductor type.

The substrate may comprise a semiconductor substrate having at least one insulating layer and said step of depositing said layer of semiconductor material onto the substrate comprises depositing the layer of semiconductor material onto the insulating layer. The method may then comprise the step of forming a conductive layer in the semiconductor substrate under said layer of semiconductor material and may involve the step of forming an electrical contact between the conductive layer and one end of the layer of semiconductor material. Forming the conductive layer may comprise forming a well of n-type or p-type semiconductor material in the substrate.

The method may also involve forming a plurality of distinct semiconductor structures on the substrate, in which case the method involves the step of forming at least one additional separate layer of semiconductor material on the substrate, forming, in said additional layer or layers of semiconductor material, at least one region of said first semiconductor type, and also forming at least one region of said second semiconductor type, said first and second regions being arranged alternately, and forming an electrical contact between each layer of semiconductor material.

BRIEF DESCRIPTION OF THE DRAWINGS

For a better understanding of the present invention, and to show more clearly how it may be carried into effect, reference will now be made, by way of example, to the following drawings, in which:

FIG. 2a illustrates a conventional poly diode element;

FIG. 2b shows a plan view of the poly diode element of FIG. 2a;

FIG. 9b illustrates the noise equivalent circuit of the poly diode of FIG. 7a;

FIG. 10b illustrates the noise equivalent circuit of the structure shown in FIG. 8a;

DETAILED DESCRIPTION OF THE PREFERRED EMBODIMENTS

The embodiments below will be described in relation to a composite diode comprising a single piece of polycrystalline silicon. However, it is noted that the invention is equally applicable to any semiconductor material for realising the composite diode having a high impedance, for example re-crystallized silicon or other semiconductor material.

It is also noted that, although the embodiments below are described in relation to biasing a MEMS microphone, the semiconductor structure is not only suited for use with any type of high impedance load, but also with applications other than biasing a capacitive transducer, for example biasing an a.c. coupled MOS gate terminal.

Figure 3:
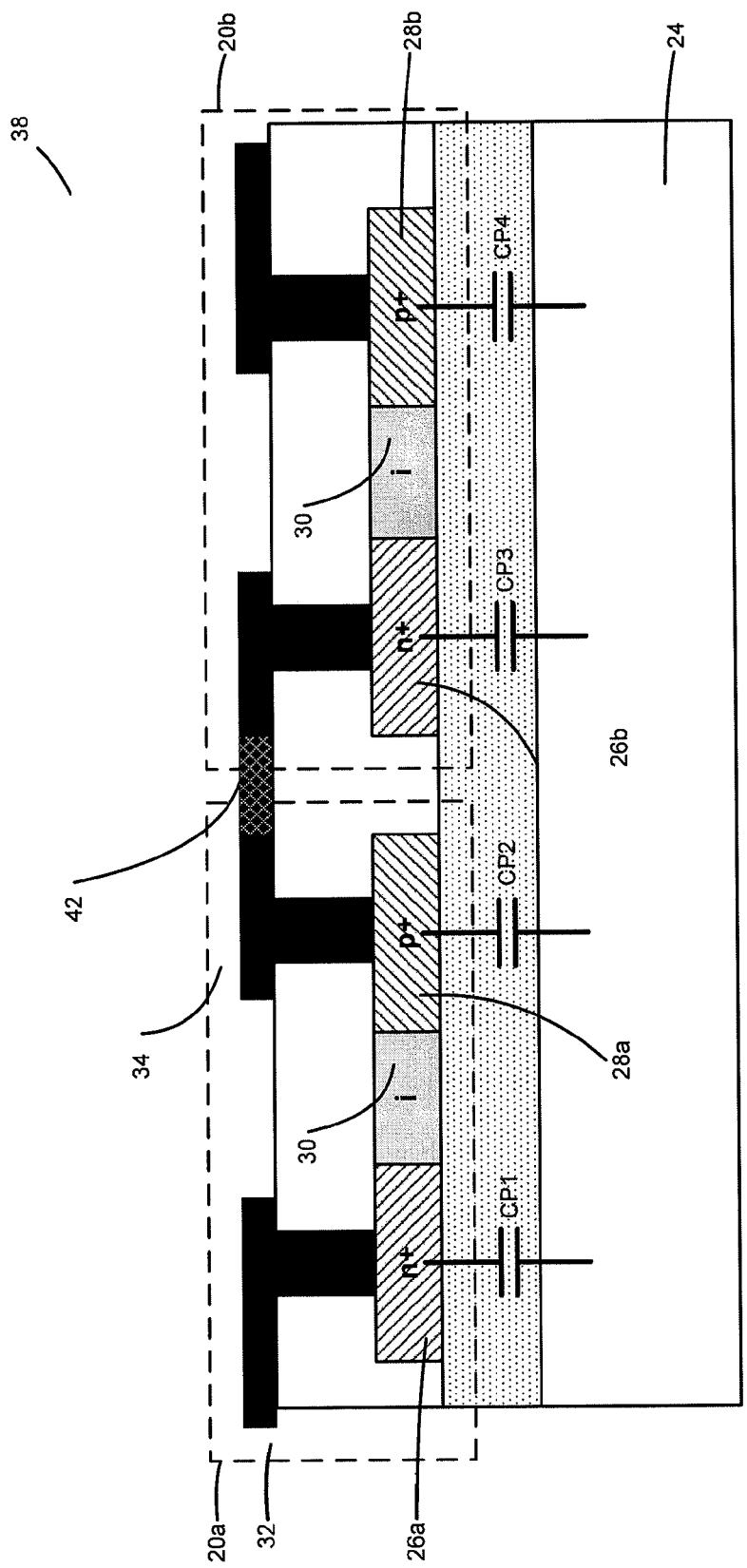
FIG. 3 illustrates a poly diode chain.

FIG. 3 shows a poly diode structure in which two poly diode elements 20a, 20b, are connected together via a metal bridge 42 to form a poly diode structure 38, thereby enabling the overall resistance of the structure to be increased (i.e. doubled, for identical poly diode elements) compared to the, single, 50 Gohm poly diode element described in the example of FIG. 2. Therefore, the diodes 16, 18 shown in FIG. 1b may be replaced with corresponding poly diodes (20a, 20b) as per this FIG. 3 so as to increase the resistance seen at the amplifier (14) input node.

The effect on the thermal noise contribution in respect of the transducer output signal by the poly diode elements 20a, 20b illustrated in FIG. 3 may be explained with reference to FIGS. 4a to 4c.

Figure 4A:
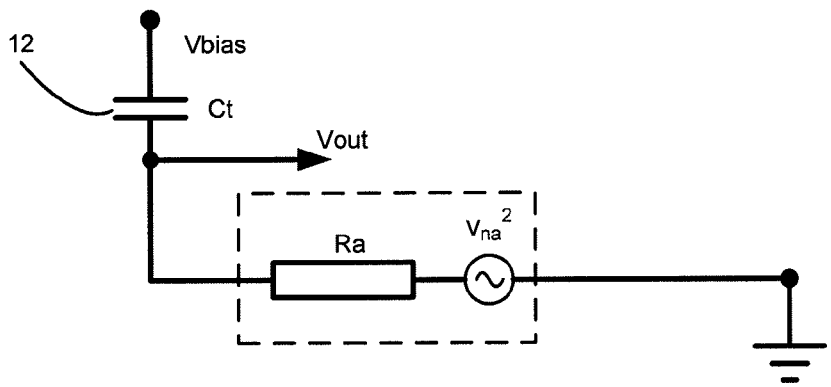
FIG. 4a illustrates the noise equivalent circuit of a single poly diode element.

FIG. 4a shows a noise equivalent circuit where the transducer capacitor Ct, 12, is biased to ground firstly by a single diode: ignoring the antiparallel diodes (16, 18) type connection for simplicity and clarity of explanation. As above, one plate of the transducer capacitor is biased to a clean, low impedance point Vbias. The voltage Vout on the other plate of the capacitor is taken and buffered for use as a signal output.

The first diode 20a is modelled as a noise voltage source Vna² in series with an equivalent noiseless resistance Ra. At d.c., or very low frequencies, the capacitor Ct will have much higher impedance than the resistance Ra, so the full noise voltage Vna² will be seen at Vout. At very high frequencies the capacitor Ct will short Vout to a.c. ground. At high frequencies, where the impedance of the capacitor Ct has reduced so that it is smaller than the resistance of resistor Ra, Vna² will be filtered by the first-order 20 dB/dec response of the low pass filter made up of resistor Ra and capacitor Ct. Thus the frequency spectrum will be as shown by the solid line in FIG. 4c.

Figure 4B:
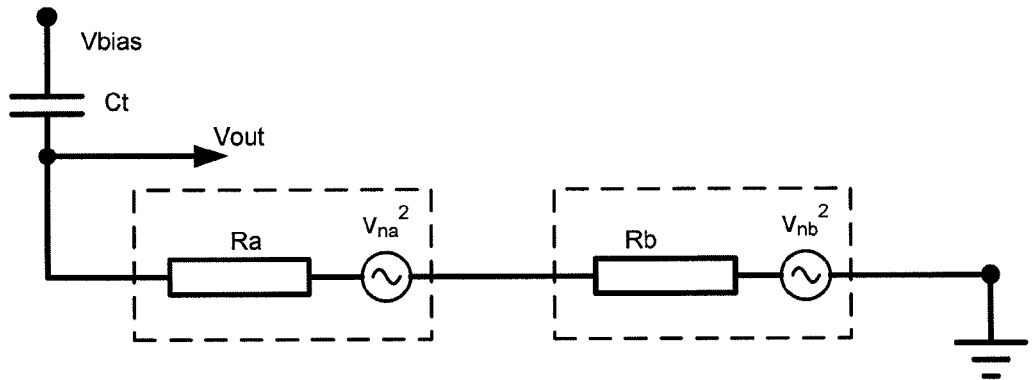
FIG. 4b illustrates the noise equivalent circuit of two poly diode elements in series such as shown in FIG. 3.
Figure 4C:
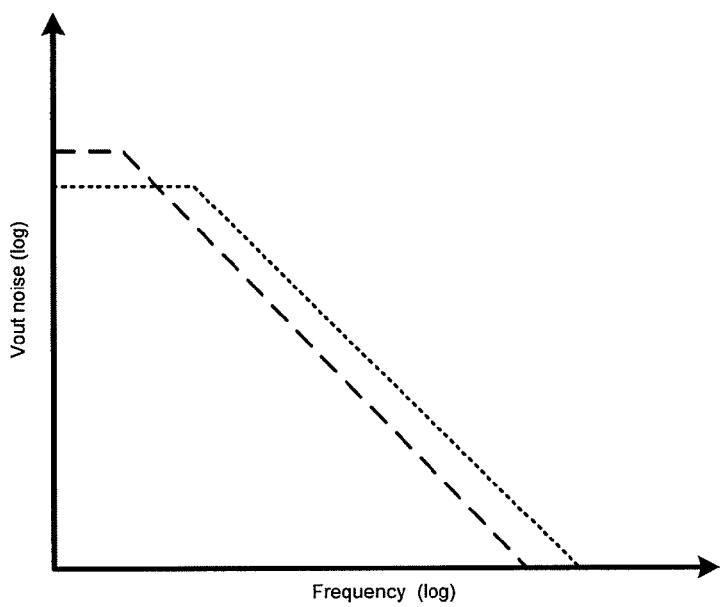
FIG. 4c shows the frequency response of the noise equivalent circuits shown in FIGS. 4a and 4b.

Adding a second diode 20b in series with the first diode 20a results in the noise equivalent circuit of FIG. 4b, with the second diode 20b contributing a series impedance Rb and noise source Vnb². At low frequencies these noise sources Vna² and Vnb² will add. If the diodes 20a, 20b are identical, so Ra=Rb and Vna²=Vnb², the noise at d.c. will increase by 3 dB. However at high frequencies, the noise of Vna² will be filtered by a low-pass filter made up of (Ra+Rb) and Ct, so its contribution to the total noise will be attenuated by 6 dB more at a given frequency. Similarly for Vnb². These contributions are uncorrelated, so will add in an rms fashion. So at a given frequency there will be 3 dB less noise at Vout due to these diodes 20a, 20b, as shown by the dotted line in FIG. 4c.

Figure 4D:
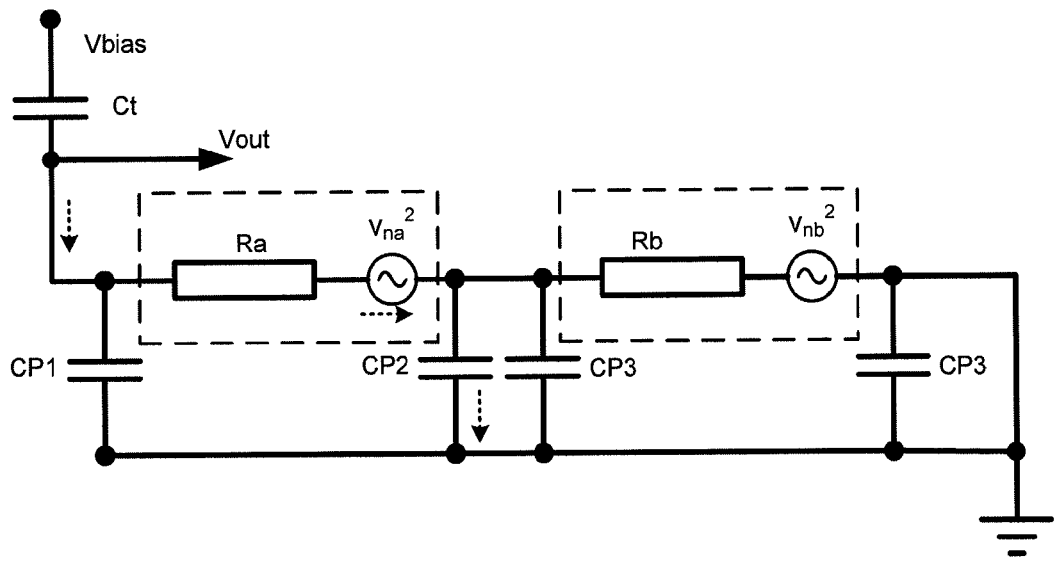
FIG. 4d illustrates a noise equivalent circuit of two poly diode elements in series such as shown in FIG. 3 including the effects of parasitic capacitance.

As the skilled person will understand there will be distributed parasitic capacitances between each of the respective regions and the substrate. Therefore, the parasitic capacitance associated with the intrinsic regions 30 is shown in FIG. 3, purely for the aid of explanation, as being included with the respective combined i.e. lumped, parasitic capacitors (CP1-CP4) associated with each of the respective n-type (26) and p-type (28) diffusions and the substrate. FIG. 4d illustrates a noise equivalent circuit including these parasitic capacitances CP1-CP4.

Figure 4E:
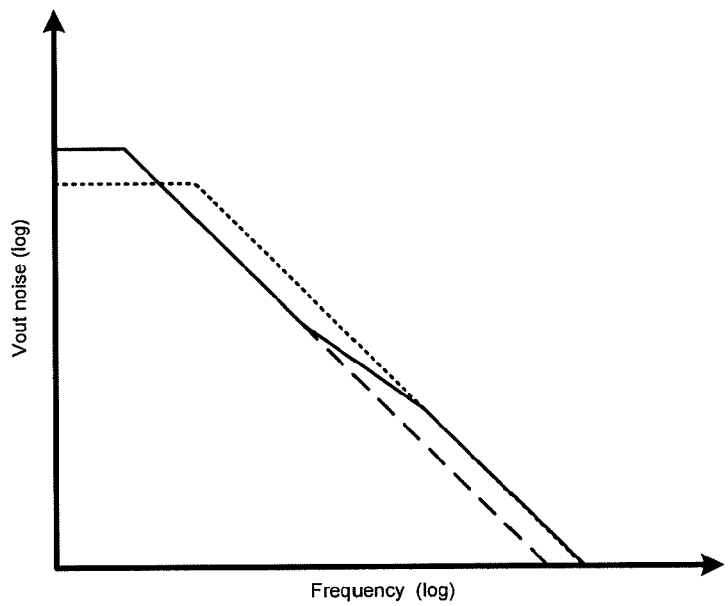
FIG. 4e shows the frequency response of the circuit shown in FIG. 4d.

At low frequencies, these parasitic capacitances CP1-CP4 have little effect. At frequencies somewhat above the corner frequency defined by (Ra+Rb) and Ct, the 3 dB noise improvement is obtained. However at frequencies above a second corner frequency defined by Rb and (CP2+CP3), noise current from Vna² finds a lower impedance path to ground via the parasitic capacitors CP2 and CP3 than through Rb, as illustrated by the dashed arrows. So at high frequencies Rb becomes irrelevant, and the noise contribution from Vna² approaches that of the single diode arrangement, as shown by the solid curve in FIG. 4e.

The value of these parasitic capacitances CP1-CP4 will depend upon various factors including the thickness and permittivity of the dielectric layer 22 and the area of the polysilicon regions. The thickness of the dielectric is defined by the manufacturing process flow, and is typically the standard field oxide thickness.

The area of the polysilicon regions is defined by the minimum contact size and minimum spacings defined in the process design rules as referred to above. For typical 0.35 µm technology, there is about 1.5 femtoFarads (fF) of parasitic capacitance to ground (assuming the substrate 24 is grounded) associated with each of the parasitic capacitances CP1-CP4. Noting that CP2 and CP3 appear in parallel, therefore the capacitance at the centre node of the two poly diode elements 20a and 20b is thus some 3 fF.

At 1 kHz, the impedance from this 3 fF is only 50 Gohm. This is equal to the equivalent resistance of each of the two diodes 20a, 20b. Thus, most of any input noise current from Vna² above 1 kHz input will pass through the parasitic capacitances CP2 and CP3 rather than through the second diode 20b. Thus, such signals will see the resistance (Ra) of only one of the diodes (20a), giving a reduction in the effectiveness of the noise filtering at such frequencies.

It should be noted that one possible way of reducing the parasitic capacitances would be to increase the distance between the doped polysilicon regions and the substrate. One could therefore consider depositing a thicker layer of dielectric 22 or depositing additional layers for the purposes of increasing the polysilicon/substrate separation, although such an approach may not be possible or practical because of other design or manufacturing constraints. The device fabrication may however involve additional deposition steps, such as deposition of additional dielectric layers, possibly in addition to metallic layers. Were these additional layers to be deposited prior to the deposition of the polysilicon layer the distance between the substrate and the polysilicon would be increased. Thus a method of manufacturing a poly diode may involve depositing the polysilicon layer intended to form the poly diode at an appropriate point in the manufacturing process so as to minimise any parasitic capacitance. The method may therefore deposit the polysilicon at a point in the process that maximises the polysilicon-substrate separation, for instance by delaying until additional device layers have been deposited. Obviously the polysilicon layer has to be deposited onto an appropriate base layer and must be deposited prior to covering layers or top contacts or the like but appropriate process design could involve at least some additional layers being deposited between the substrate and the polysilicon layer.

More than two poly diode elements 20a, 20b, may be connected together using further electrodes 42 in an attempt to form a diode chain with even higher equivalent resistance. But adding further diodes makes successively less difference, as most of the signal is shunted to substrate in the first few diodes.

Figure 5:
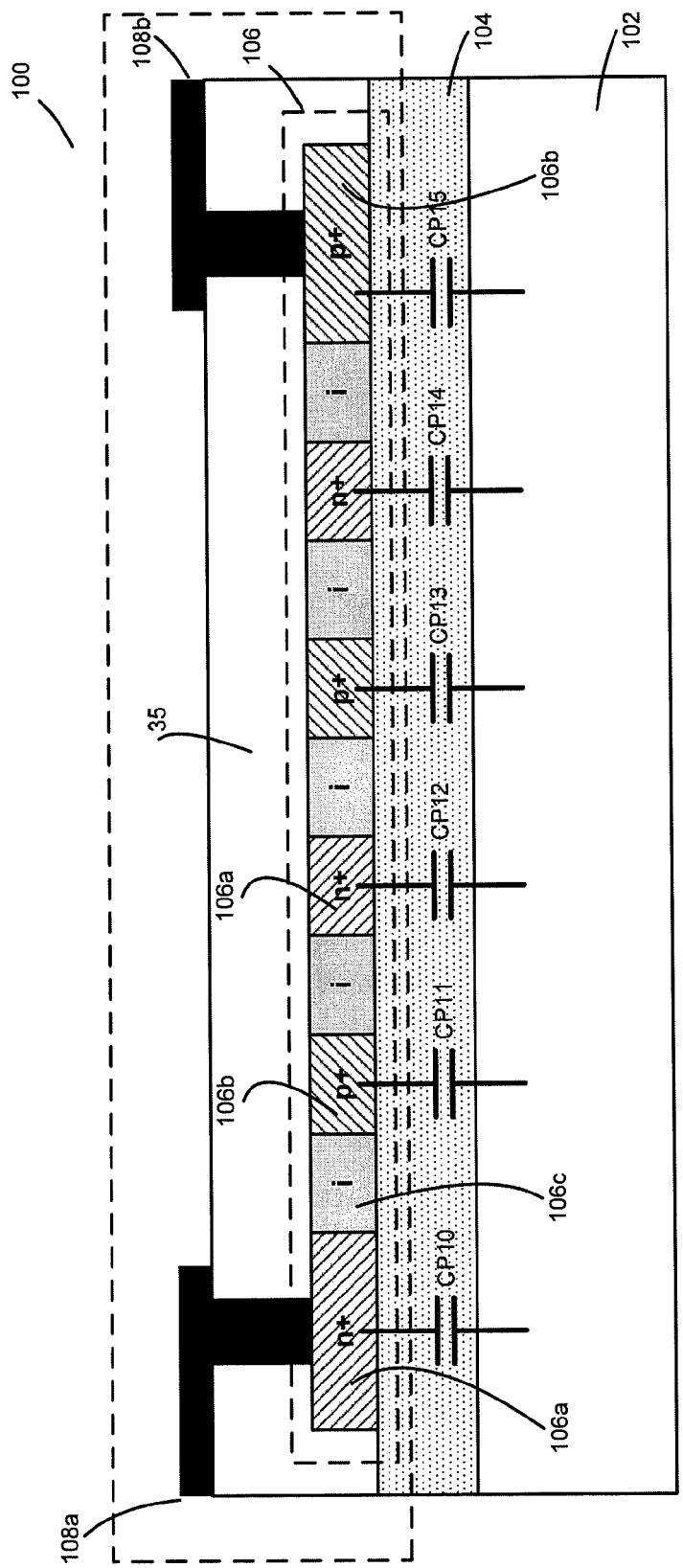
FIG. 5 illustrates a poly diode according to an embodiment of the present invention.

FIG. 5 shows an embodiment of a semiconductor structure 100 according to the present invention.

The semiconductor structure 100 of this embodiment comprises a strip 106 of semiconductor material, for example polycrystalline silicon, deposited on an oxide layer 104 (for example $SiO_2$), which has previously been deposited on a semiconductor substrate 102 (for example a silicon substrate). The strip of semiconductor material 106 is a continuous strip of material in that the strip is not formed from discrete pieces of material. The strip is monolithic in the sense of being a single continuous piece of material. The skilled person will appreciate that in this sense the term monolithic does not mean that the material is a single crystal piece of material and that the monolithic strip may be polycrystalline.

The strip 106 comprises a plurality of doped regions having alternating n-type regions 106a and p-type regions 106b.

As mentioned above, direct junctions between n- and p-type regions can cause leakage, and therefore in the illustrated embodiment the n- and p-type regions are preferably separated by regions 106c of substantially intrinsic semiconductor material (for example, polysilicon). It is noted, however, that the regions 106c may have some degree of doping. For example, while the doped regions (106a, 106b) may be doped to in excess of say $10^{15}/cm^3$ for example, the intrinsic regions may be doped to substantially less than $10^{15}/cm^3$, say $10^{11}/cm^3$ for example. Other values or ratios are also possible, especially if other semiconductor materials are used as is readily understood by those skilled in the art.

The semiconductor structure thus has a series of n-i-p or p-i-n junctions. Each such junction, in effect, acts a poly diode described above and adjacent junctions are effectively electrically connected in the series. Thus the structure shown in FIG. 5, starting from the left has an n-i-p junction, followed by a p-i-n junction, followed by another n-i-p junction, then a second p-i-n junction and finally a last n-i-p junction. Each junction could be seen as a diode element similar to a single junction poly diode such as shown in FIG. 2a. The structure may therefore be seen as a composite diode, i.e. a device having a plurality of diode elements connected in series. As is usual for diodes the composite diode is operably connected as a two terminal device.

The terminals of composite diode 106 are the first and second ends. In the embodiment of FIG. 5 the first and second ends of the diode 106 are shown as being connected, to a first electrode 108a and a second electrode 108b, respectively. It is noted, however, that one or both of the electrodes 108a and 108b may be omitted, for example when the regions of alternating doped regions 106 is/are directly coupled for example to a polysilicon gate of an amplifier input MOS gate, or directly connected to a plate of a polysilicon capacitor.

The electrodes 108 may be formed from any suitable conducting material (as dictated by the manufacturing process in use) such as metal, for example gold, aluminium or copper. These conductors may comprise multiple metal layers, including for example titanium. The interface between the electrodes 108 and the respective n-type and p-type regions may include a layer of silicide or salicide (not illustrated). One or more other layers (not shown) may be provided, for example multiple overlying metal layers with dielectric layers between them or passivation layers to provide environmental protection.

The embodiment illustrated in FIG. 5 shows a strip 106 formed from a single piece of semiconducting material (e.g. polysilicon), comprising a plurality of doped regions, in this example three n-type regions 106a, three p-type regions 106b, and five intervening intrinsic regions 106c. However, it will be appreciated by those skilled in the art that different numbers of regions are contemplated. For example, the strip 106 may comprise a single n-type region with two p-type regions either side of it, or conversely a single p-type region with two n-type regions either side of it.

The number of p-n junctions, which, as will be appreciated, is equal to the number of intervening intrinsic regions, may be an odd or even number and is chosen according to the desired resistance value for a particular application of the composite diode 100. As mentioned above each p-i-n junction can be thought of as a separate p-i-n diode and for N diodes the total equivalent DC resistance will be N.(mkT/q)/Is.

The doped regions at the respective ends of the strip 106, i.e. having the electrodes 108a, 108b connected, have a certain minimum size in view of the physical constraints imposed by the size of the metal-polysilicon contacts and the required spacings (as explained above with reference to FIG. 2b). One advantage of the embodiment shown in FIG. 5 over that illustrated in FIG. 3 is that the inner doped regions, i.e. the doped regions located between the end regions associated with the electrodes 108a, 108b, can be reduced in size. This is because no electrodes are required to connect the inner regions to one another or to an end region to form a diode chain structure. Thus, each of the values of the parasitic capacitances CP11-CP14 from each of the respective inner n- or p-type doped regions (106a, 106b) to the semiconductor substrate 102 is reduced. On a typical 0.35 μm silicon process these parasitic capacitances CP11-CP14 are typically about 0.6 fF compared to the 3 fF total (CP2+CP3) of the structure of FIG. 3. So the shunt impedance to ground, assuming the substrate 102 is grounded, at each internal node of the diode string 106 is increased by a factor of about 5 in this example. This reduced value of total parasitic capacitance pushes out the frequency at which most of the signal current is shunted to ground for a fixed number of diode elements, i.e. p-n or n-p junctions, or allows more diode elements to be usefully employed for the same corner frequency, thus allowing a reduction in noise over the structure of FIG. 3. The size of the inner regions doped regions is therefore conveniently the minimum that allows the regions to still function correctly. The minimum size achievable may however be limited by the fabrication processes available in standard fabrication processing and hence the inner regions may be specified in the process as minimum size regions (i.e. the minimum size achievable). Conveniently the size of the inner doped regions are uniform (allowing for manufacturing tolerances) but in some applications the size of the inner regions may vary from one part of the semiconductor structure to another. Likewise the end regions forming the terminals may be the same size or different sizes as required.

The optimum choice of the number of p-i-n (or n-i-p) junctions N (where N therefore equals the number of intrinsic regions) will depend on the diode characteristics of the polysilicon diodes, for example, the saturation current "Is" and the capacitances associated with polysilicon diodes on the particular manufacturing process and geometries to be used.

Figure 6:
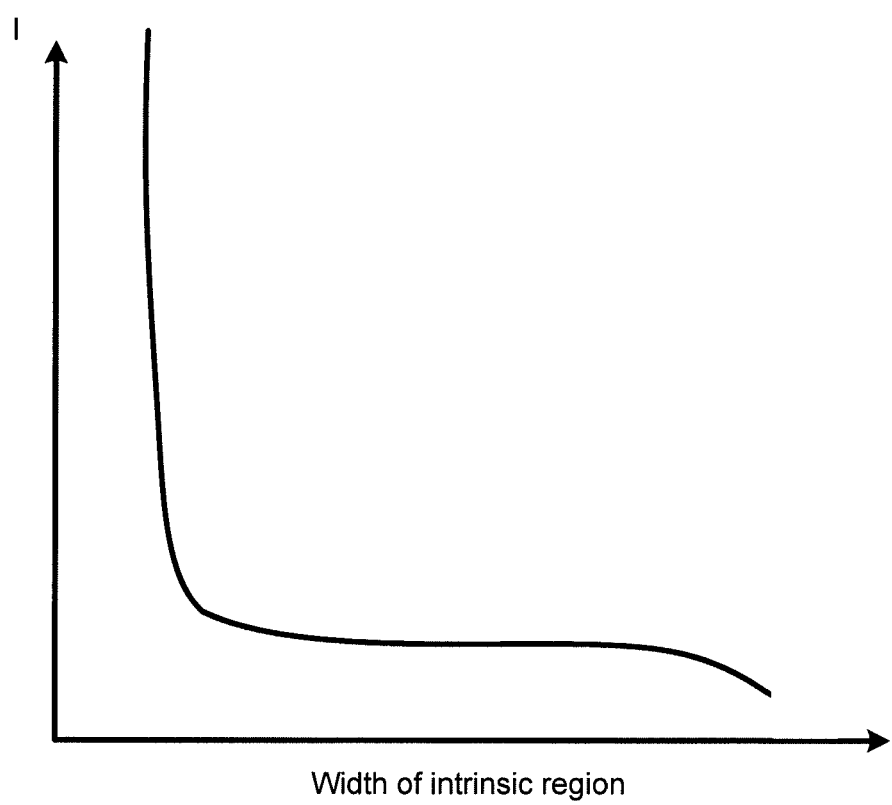
FIG. 6 shows a graph of width of intrinsic region against current flow for a poly diode semiconductor subject of the present invention.

Another design consideration is the width of the intrinsic regions. As mentioned above, where a polysilicon n type region is in direct contact with a polysilicon p type region, low reverse breakdown voltages and/or high leakage of current are observed due to grain boundary effects. Having an intrinsic region between the n and p type regions will increase breakdown voltage and decrease current leakage slightly but a very thin layer will have only a small effect. Conversely if the intrinsic region is too wide the device ceases to act as a p-n junction. FIG. 6 shows an idealised plot of the effect of width of the intrinsic regions on leakage current at a set voltage. It can be seen that below a certain minimum width of intrinsic region the leakage current is high but once a certain width is achieved a relatively stable window is reached where the presence of the intrinsic region mitigates for grain boundary effects. Beyond a certain width however the leakage current starts to drop off as the device ceases to function as a junction device. Conveniently the width of the intrinsic region is chosen to be within the stable window for the particular material system (i.e. the nature and level of doping). This means that minor variations in the width of the intrinsic region from one junction to the next has a minimal effect on the composite diode characteristics.

Conveniently each p type region is formed using the same dopants to the same level but in some applications it may be wished to vary the doping level and/or the dopant from one p type region to the next. Similarly each n-type region is conveniently doped in the same way as each other n type region but again this may be varied if desired.

Figure 1A:
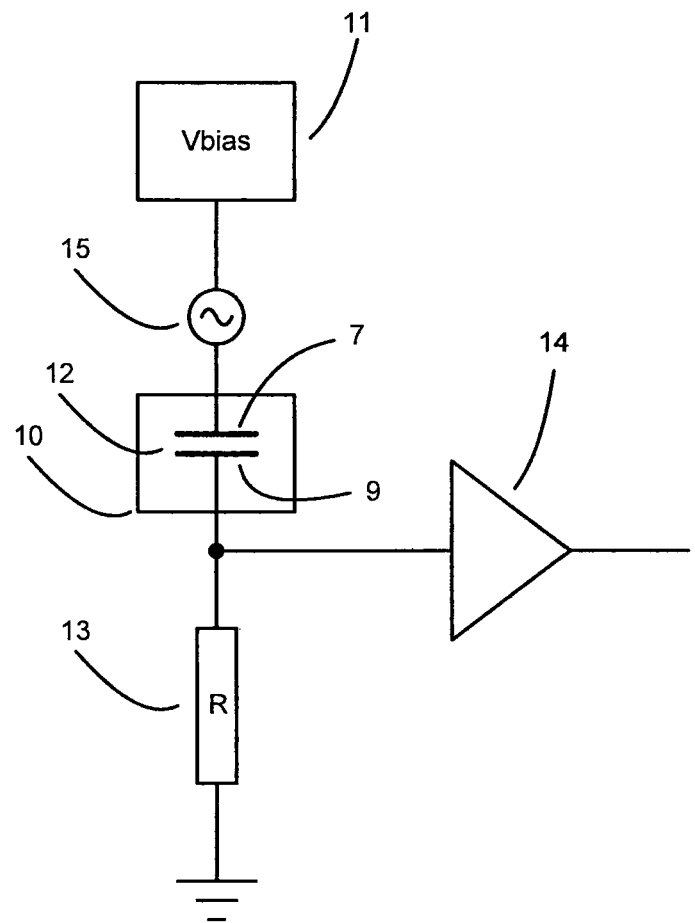
FIG. 1a illustrates a known electronic circuit for a transducer.

A further advantage associated with the present invention relates to the symmetry of the current-voltage characteristics. In order to avoid rectifying large low frequency signals or transients, such as from a door slamming (which is a standard/common overload type test for MEMS microphones), it is important that the current-voltage characteristic seen at the amplifier (14) input is symmetric about the chosen reference voltage, i.e. that the current-voltage characteristic of the diode structure comprising an equivalent resistance R to that of resistor 13 of FIG. 1a is symmetric.

Figure 7:
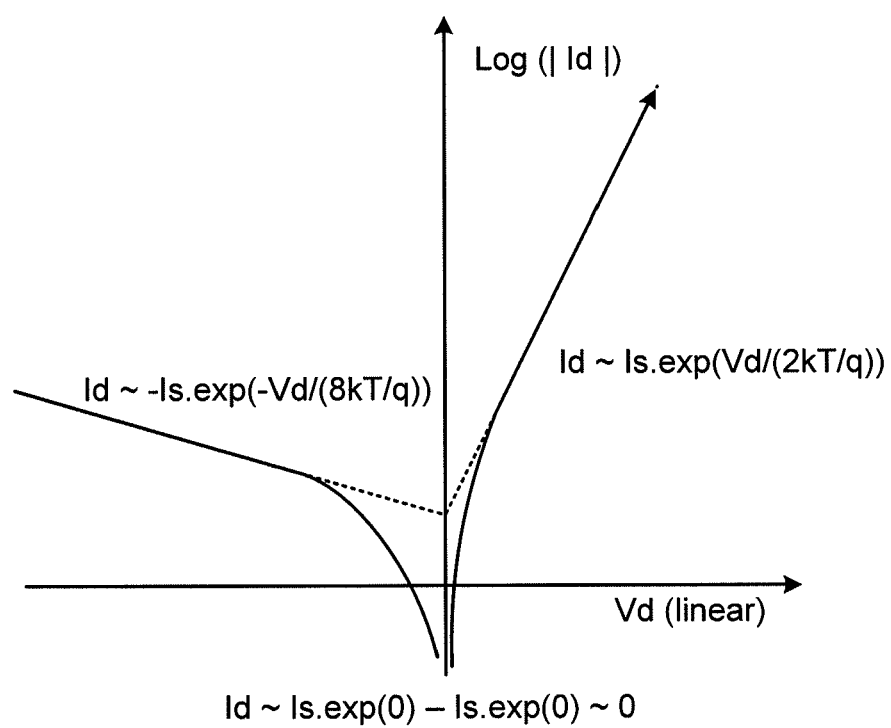
FIG. 7 shows the current voltage characteristic of a single poly diode element.

FIG. 7 shows the current-voltage curves for a single poly diode (20), i.e. a single p-i-n type structure such as shown in FIG. 2. In forward bias, the current asymptotes to Is.exp(Vd/(2.kT/q), so Vd=(2 kT/q)ln(|Id|). In reverse bias, the current asymptotes to Is.exp(Vd/(8.kT/q) so Vd=(8 kT/q)ln(|Id|). This leads to a manifestly grossly asymmetric characteristic.

Figure 1B:
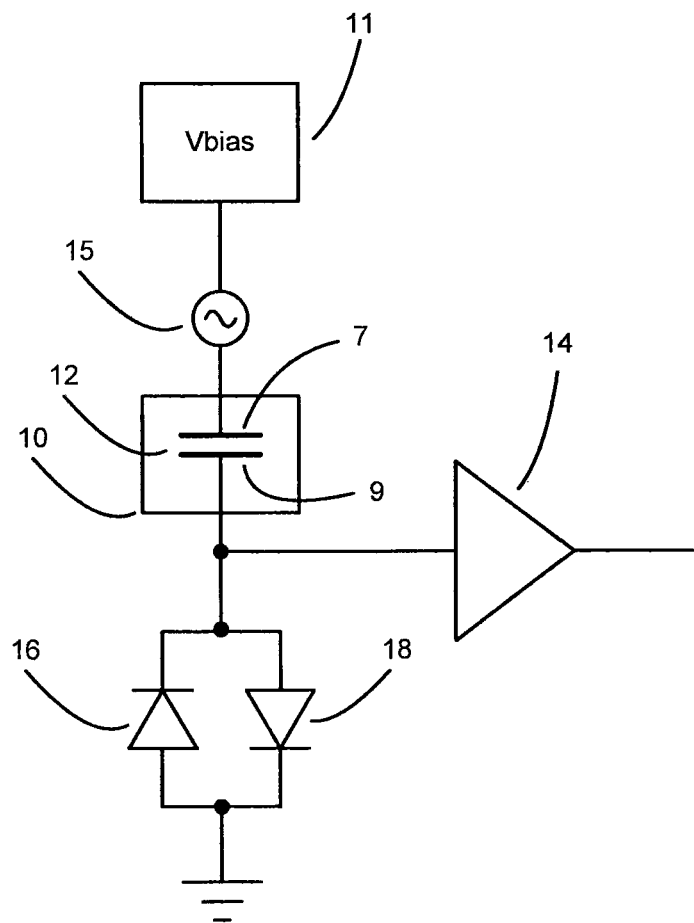
FIG. 1b illustrates an alternative known electronic circuit for a transducer.

If two such diodes (20) are placed in antiparallel, as shown in FIG. 1b, the overall characteristic, i.e. the current-voltage characteristics for the combination must become symmetric. But the zero-bias conductance is thus halved. However, if two such diodes are placed in series, the overall voltage drop becomes $(2\,kT/q)\ln(|Id|)+(8\,kT/q)\ln(|Id|)=(10\,kT/q)\ln(|Id|)$, leading to a symmetric Id-Vd characteristic.

Figure 8A:
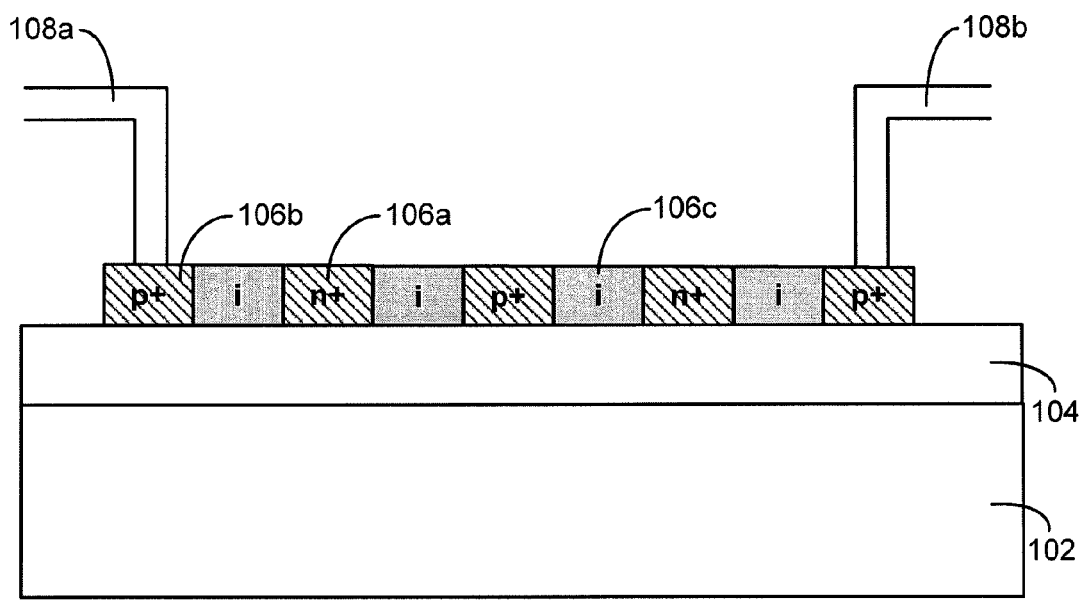
FIG. 8a shows another embodiment of a semiconductor structure according to the invention.
Figure 8B:
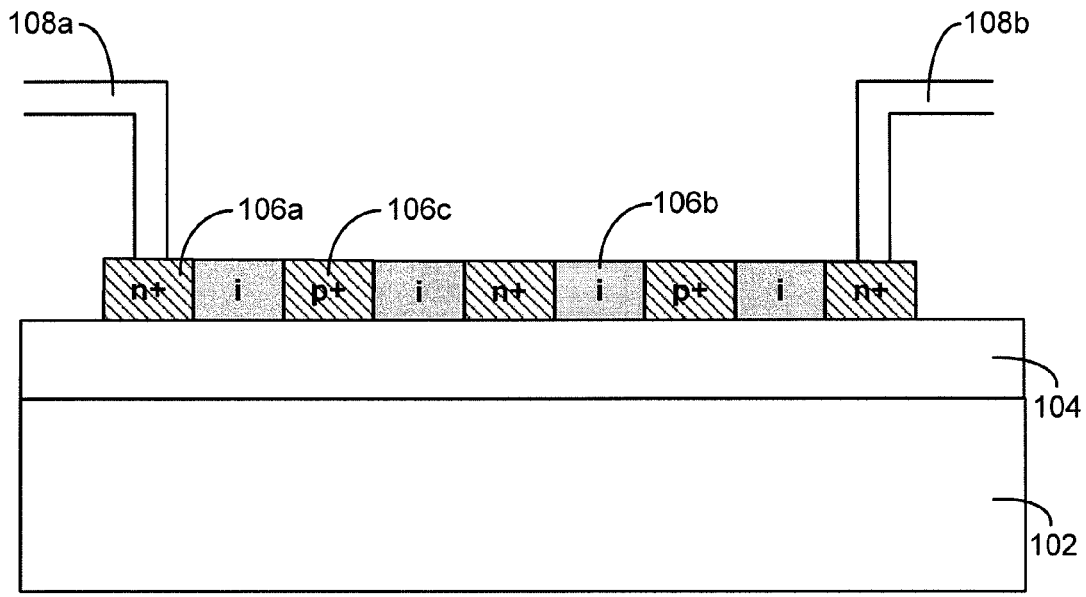
FIG. 8b shows a further embodiment of a semiconductor structure according to the invention.

The semiconductor structure according to the present invention is arranged such that an inner region of one type, say p-type, is separated by an intrinsic region from a region of the opposite type, n-type, on each side. Thus, the semiconductor structure 106 is naturally arranged such that the multiple p-n junctions are arranged in the order n-i-p-i-n . . . (or equally p-i-n-i-p . . . ). If there are an equal number of n-i-p junctions and p-i-n junctions (which would lead to an even number N of intrinsic regions) the DC characteristic of the poly diode 100 is symmetric around zero, thus reducing any rectification effects of large incoming signals, which might otherwise give a DC shift in the average output voltage. An even number N of intrinsic regions 106c is therefore advantageous in some applications where a symmetric response is preferred. FIG. 8a shows a semiconductor structure according to the present invention which is substantially similar to the composite diode 100 described with respect to FIG. 5, and therefore like features are referenced with like numerals. The composite diode of FIG. 8a however is symmetrical having two n type regions 106a arranged between three p type regions 106b (and hence four intrinsic regions 106c). Such a device would have a symmetrical dc response. FIG. 8b shows another composite diode which can be considered the opposite of that shown in FIG. 8a, i.e. each p-type or n-type region of the diode shown in FIG. 8a corresponds to a region of the opposite type in that shown in FIG. 8b.

As mentioned above the semiconductor structures shown in FIGS. 8a and 8b have a symmetric dc response (although they may have a different dc response at high frequency due to shorting to ground). As such the composite diodes shown in FIGS. 8a and 8b do not have clearly defined forward and reverse directions such as standard pn junction diode would. It will therefore be understood that as used herein the term diode is not limited to mean devices with forward and reverse directions.

As described in respect of FIG. 3, it will be appreciated that the physical size of the composite diode 100 can be reduced when one or both of the electrodes 108a and 108b are omitted entirely, for example by a direct connection only to a poly gate or poly resistor, since the first and second ends of the monolithic strip 106 may be made smaller.

Although the strip 106 of FIG. 5 is shown as being formed as a simple bar, it should be noted that the diode structure 106 can be any shape, depending on electrical parameters of the process and requirements of the application, including, but not limited to, a curve, a horse shoe shape or concentric rings.

It will therefore be appreciate that the semiconductor structure described in FIG. 5 enables a higher impedance device to be formed than the structures of FIGS. 2 and 3. The composite structures shown in FIGS. 8a and 8b also provide an improved symmetrical impedance that has the advantageous described above.

Figure 9A:
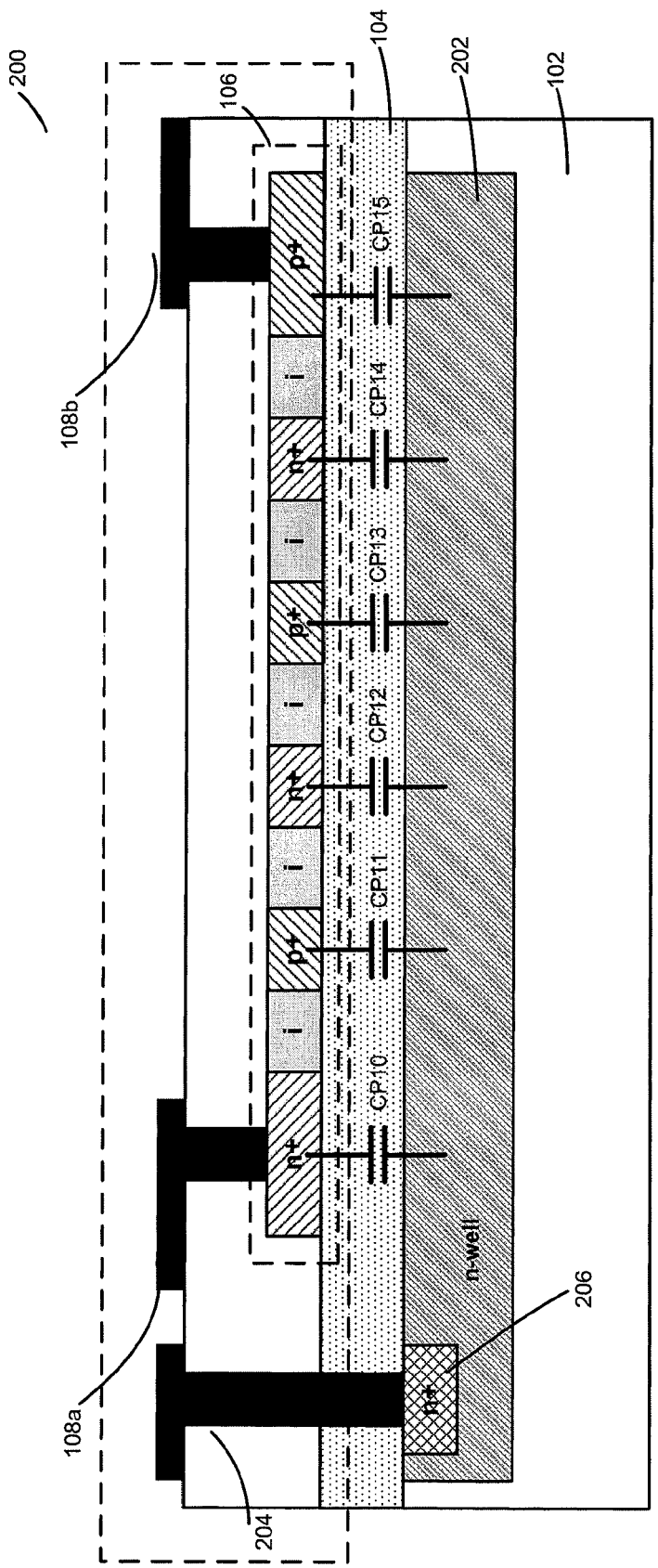
FIG. 9a illustrates a poly diode according to a further embodiment of the present invention.

FIG. 9a illustrates a composite diode 200 according to a further embodiment of the invention. The composite diode 200 is substantially similar to the composite diode 100 described with respect to FIG. 5, and therefore like features are referenced with like numerals.

As mentioned above, though the structure of FIG. 5 reduces the parasitic capacitances CP11-CP14 to ground, the improvement gained is still eventually limited by these reduced internal capacitances CP10-CP15 shunting signal or noise current to ground. In order to overcome this, the composite diode 200 of FIG. 9a further comprises a conductive layer, for example a well 202 formed in the semiconductor substrate 102. The well 202 comprises n-type material, for example (assuming the substrate is p-type), and extends substantially underneath the strip 106. At one end, the well 202 is connected to one end (108a) of the diode element 106 through an electrode 204, in the illustrated embodiment via a region 206 of increased doping that is formed from n+ material). Although not illustrated, preferably electrode 108a is also connected to electrode 204.

Since there is now little voltage across the parasitic capacitances near to electrode 204, it might be expected that there would be an improvement in performance. However the dominant noise source at high frequencies is now the effective diode (i.e. the n-i-p junction) at the other end, i.e. the 108b end, of the strip 106 (assuming electrode 108b is connected to ground) which conducts noise to node 204 through CP14. If the n-well 202 were connected to the ground end (108b) of the strip 106 rather than to the signal end (108a), the electrical behaviour becomes identical to the structure illustrated in FIG. 5, with the ground node now being the nwell rather than the substrate. The only advantage of these structures is the possibility of shielding noise which might be present in the substrate shared with other circuitry.

Figure 9B:
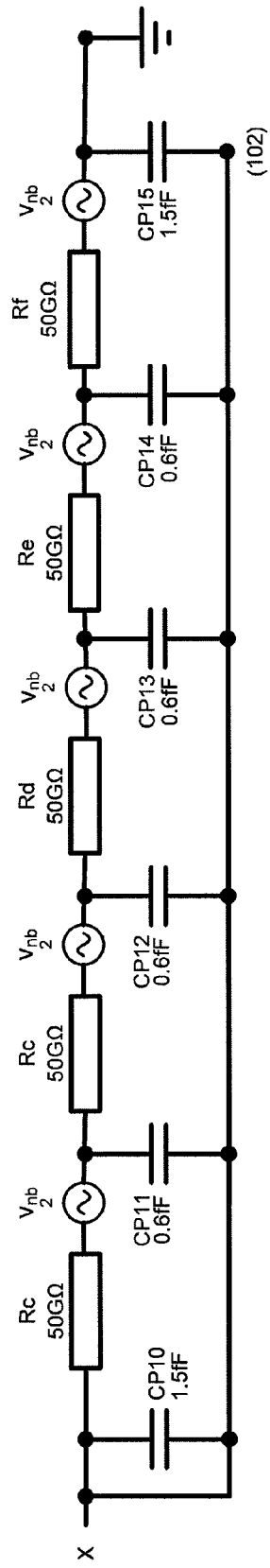

FIG. 9b illustrates the noise equivalent electrical circuit of the poly diode structure illustrated in FIG. 7a.

However, two or more composite poly diodes 200 may be connected together to improve the frequency response, as described further below.

Figure 10A:
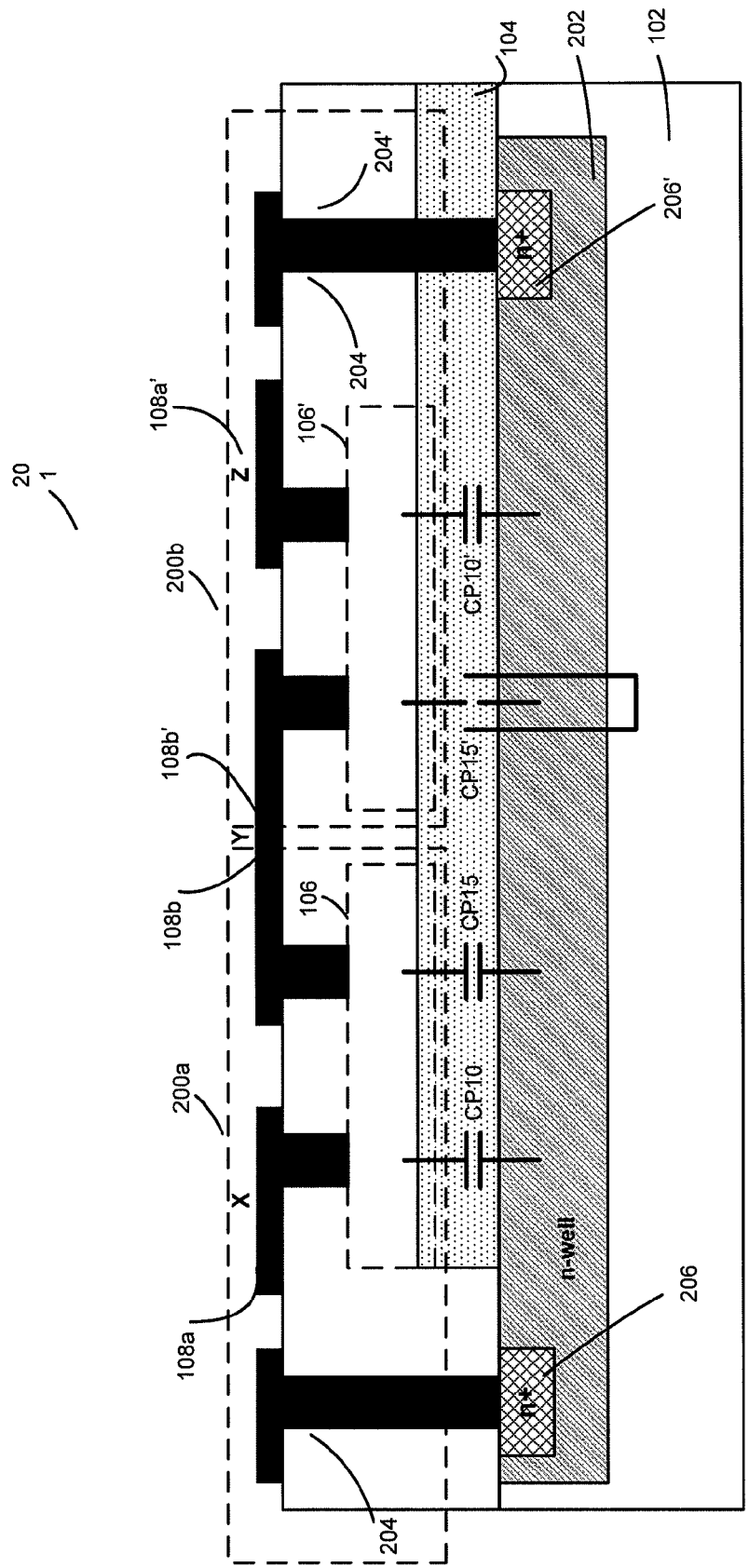
FIG. 10a illustrates a structure according to an aspect of the present invention having two composite diode structures connected in series.
Figure 10B:
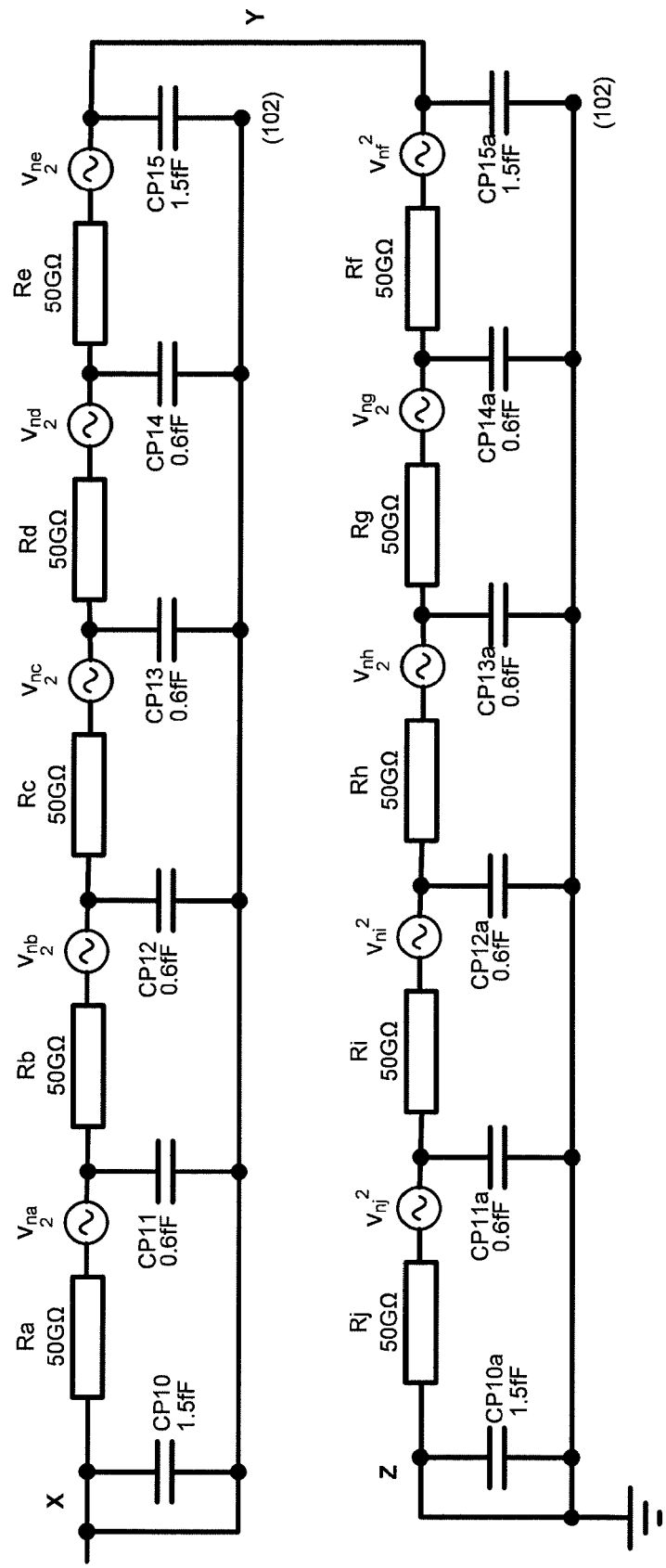

FIG. 10a illustrates a diode structure 201 comprising two composite diodes 200a, 200b electrically connected to each other via their respective electrodes 108b, 108b', and FIG. 8b illustrates the noise equivalent circuit. Each composite diode could have the structure such as shown in any of FIG. 5, 8a, 8b or 10a. The innermost diode elements, i.e. p-i-n or n-i-p junctions, from the electrode ends 204, 204', still contribute most of the noise at high frequencies, but they are no longer directly connected to ground, so noise from their noise sources $Vne^2$ and $Vnf^2$ have to pass through capacitances CP14 or CP14' (not illustrated), which reduces their contribution at audio frequencies.

Of course, those skilled in the art will appreciate that more than two composite diodes 200 may be connected together in series to create a size of diode structure as is needed. In one example embodiment, the diode structure may comprise two composite poly diodes, each with sixteen p-i-n diode pairs. In another example embodiment, the diode structure comprises eight poly pin diodes, each with four pairs. It will be appreciated that the invention encompasses a diode structure having any number of poly diodes connected together, wherein at least one of the poly diodes has two or more p-n pairs. Although the examples above describe each poly diode in the overall structure having an equal number of p-n pairs, it is noted that the invention also encompasses a structure wherein a poly diode in one section has a different number of p-n pairs to a poly diode in a different section of the overall structure. For example, the number of p-n pairs in each section can be tuned according to a particular application or technology. A non-uniform structure might also be used to yield an optimum performance, for example when using an uneven number of blocks such as three.

Figure 11:
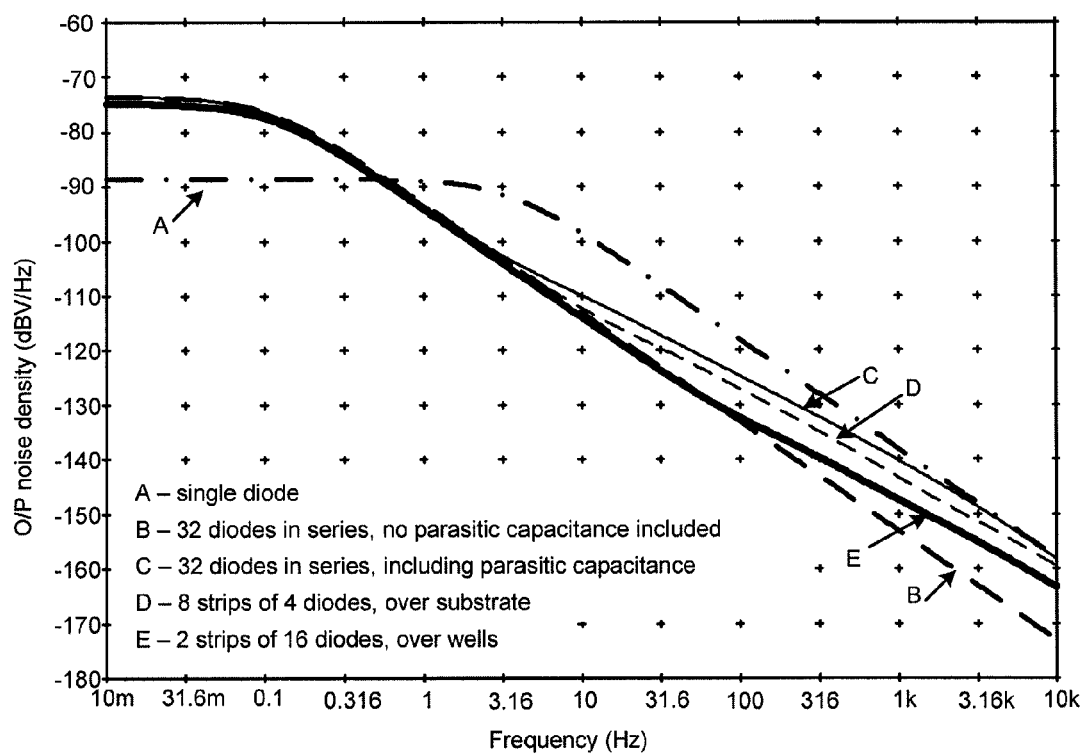
FIG. 11 shows the simulated noise spectra for various structures.

FIG. 11 shows the simulated noise spectra for various structures. These simulations include second-order effects, such as the parasitic capacitances from the n-wells to substrate. Curve A shows the noise for a single diode. Curve B for 32 diodes in series, as discrete structures with metal bridges, but simulated ignoring parasitic capacitances. Curve C shows how the performance of this structure degrades when parasitic capacitances are included. Curve D shows 8 strips, each having 4 pin/nip junctions, giving some 3 dB better performance at audio frequencies. Curve E shows simulated performance using 2 strips of 16 pin/nip junctions (effectively 16 diodes in series) each, with underlying nwells connected to the two ends of the total string, giving some 6 dB better performance in most of the audio band than the structure of curve C.

Figure 12:
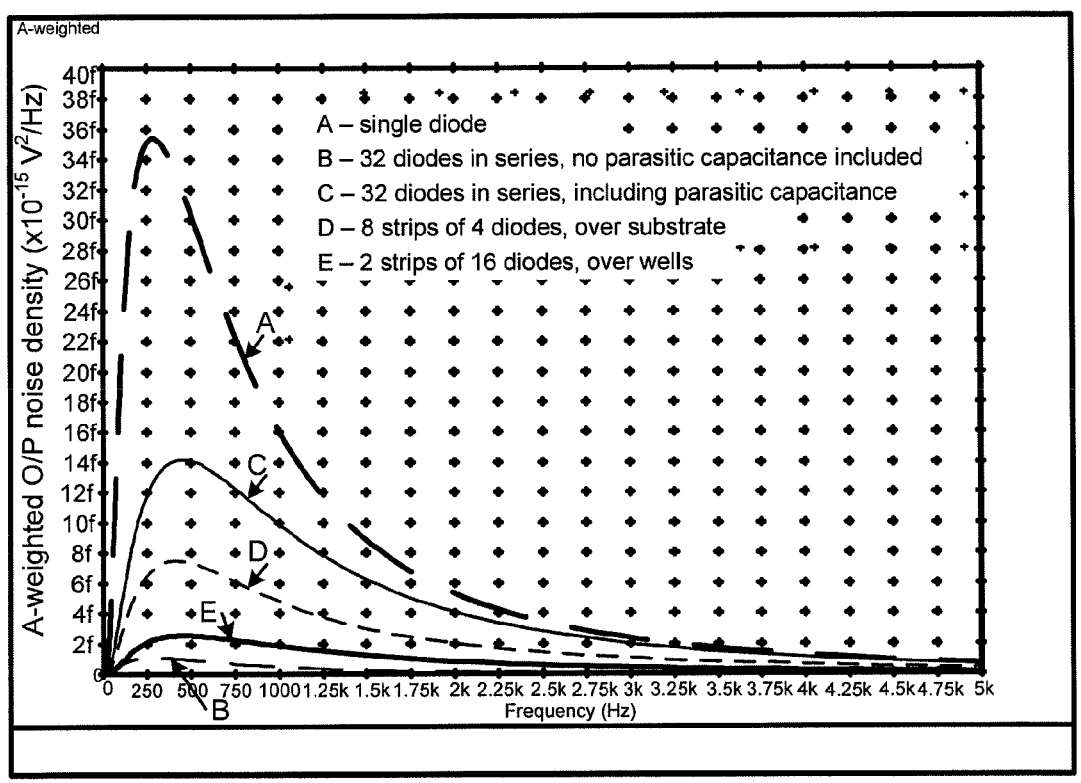
FIG. 12 shows the noise spectra shown in FIG. 9 on a linear power scale and A weighted.

On this log scale the noise improvement does not appear dramatic, but FIG. 12 shows noise from the same structures plotted on a linear power scale and A-weighted, as is normal for audio noise measurements. The area under each curve corresponds to the total A-weighted noise power.

The composite diodes described herein may be employed in transducer circuits, and particularly MEMS transducer circuits, to bias the transducer and amplifier.

In a particular embodiment, two composite diodes may be connected in parallel and opposite. By opposite is meant that, at each end of the parallel connection, if the first diode has a p type region terminal region then the second diode has an n type and vice versa. With such an arrangement symmetry provides an advantage, for example when recovering from a symmetrical overload burst of high signal frequency. Although a single composite diode structure with even number of intrinsic regions is already symmetric at d.c. and substantially symmetric electrically at low frequencies, at high frequencies the whole of the composite diode may not play an effective part—which could lead to an non-symmetric response. By arranging two diodes in parallel and opposite the response must be symmetric. This provides less shift in d.c. bias after such a transient, even one containing higher frequencies, but at the expense of greater noise and halving the impedance with respect to a single structure.

The invention enables a plurality of composite diodes to be connected in series in order to achieve a desired resistance value, but without having the drawbacks associated with the parasitic capacitances of the prior art.

The invention has been described with reference to biasing a MEMS transducer but may be used for any device where high impedance is required and may be used for biasing other devices or components. A MEMS transducer utilising the present invention may be embodied in a number of systems and devices, including, for example, medical ultrasound imagers and sonar receivers and transmitters, as well as mobile phones, PDAs, MP3 players and laptops for gesture recognition purposes.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single processor or other unit may fulfil the functions of several units recited in the claims. Any reference signs in the claims shall not be construed so as to limit their scope.

What is claimed is:

1. A device comprising:
   a MEMS transducer; and
   a biasing means for applying a voltage bias to said MEMS transducer, wherein the biasing means comprises first and second semiconductor structures that are electrically connected in parallel, each of said first and second semiconductor structures comprising:
   a continuous structure of semiconducting material comprising a plurality of regions of first semiconductor type, being n type or p type, and a plurality of regions of a second semiconductor type, being n type or p type and the opposite type to the first type, the regions of first semiconductor type and second semiconductor type being arranged alternately,
   the first and second semiconductor structures being connected in parallel such that, at each end of the parallel connection, the first semiconductor structure has a region of the opposite semiconductor type of the second semiconductor structure.

2. A device as claimed in claim 1 wherein the first and second semiconductor structures are electrically connected to the device via two terminals.

3. A device as claimed in claim 1, wherein said continuous structure further comprises a plurality of regions of a third semiconductor type, said third semiconductor type being one or more of substantially intrinsic, lightly doped p-type or lightly doped n-type, arranged between respective regions of first semiconductor type and regions of second semiconductor type.

4. A device as claimed in claim 3 wherein the width of the regions of third semiconductor type is within the range of 0.2 to 5 microns inclusive.

5. A device as claimed in claim 1 having a saturation current in the range of 10 fA to 100 pA.

6. A device as claimed in claim 5 wherein the saturation current is in the range 0.2-5 pA.

7. A device as claimed in claim 1 wherein, for each continuous structure of semiconducting material, there are an even number of regions of the first semiconductor type and an odd number of regions of the second semiconductor type.

8. A device as claimed in claim 1, further comprising an electrode connected to a first end of the continuous structure.

9. A device as claimed in claim 8, further comprising an electrode connected to a second end of the continuous structure.

10. A device as claimed in claim 1 wherein regions of the first or second semiconductor type at the ends of the continuous structure are larger in size than any regions of the first or second conductor type between the ends of the continuous structure.

11. A device as claimed in claim 1 wherein the continuous structure is formed laterally on a substrate.

12. A device as claimed in claim 11 wherein the substrate comprises a semiconductor substrate and at least one insulating layer, the continuous structure being formed on said insulating layer.

13. A device as claimed in claim 12 further comprising a conductive layer formed under the continuous structure in the semiconductor substrate.

14. A device as claimed in claim 13, wherein the conducting layer is a well of n-type or p-type semiconductor.

15. A device as claimed in claim 14, wherein the well is electrically connected to one end of the continuous structure.

16. A device as claimed in claim 1, wherein the semiconducting material of said continuous structure is silicon.

17. A device as claimed in claim 16 wherein the semiconductor material of said continuous structure is polycrystalline silicon.

18. A device as claimed in claim 1, wherein the continuous structure is straight, curved, or formed into a circular configuration.

19. A device as claimed in claim 1 wherein said MEMS transducer comprises:
   a first capacitive plate;

a second capacitive plate; and said biasing means is arranged to bias the second capacitive plate with respect to the first capacitive plate.

20. A device as claimed in claim 19 wherein the first and second semiconductor structures are electrically connected between the second capacitive plate and a reference voltage level.

21. A device as claimed in claim 1 wherein the device comprises an amplifier for amplifying an electrical output of the MEMS transducer and said biasing means is arranged to bias the amplifier.

22. A device as claimed in claim 1 wherein the device is one of an ultrasound imager; a sonar transmitter; a sonar receiver; a mobile phone; a personal desktop assistant; an MP3 player; and a laptop.

23. A method of biasing a MEMS transducer comprising the steps of arranging a high impedance element between the MEMS transducer and a reference voltage level wherein said high impedance element comprises first and second semiconductor structures that are electrically connected in parallel, each of said first and second semiconductor structures comprising:

a continuous structure of semiconducting material comprising a plurality of regions of first semiconductor type, being n type or p type, and a plurality of regions of a second semiconductor type, being n type or p type and the opposite type to the first type, the regions of first semiconductor type and second semiconductor type being arranged alternately;

the first and second semiconductor structures being connected in parallel such that, at each end of the parallel connection, the first semiconductor structure has a region of the opposite semiconductor type to the second semiconductor structure.

24. A method of biasing a device as claimed in claim 23 wherein the transducer comprises a first capacitive plate and a second capacitive plate and the method involves electrically connecting said high impedance element between said second capacitive plate and the reference voltage level.

25. A method as claimed in claim 23, wherein said step of arranging a high impedance element further comprises using said high impedance element that includes a plurality of regions of third semiconductor type, said third semiconductor type being one or more of substantially intrinsic, lightly doped p type or lightly doped n type semiconductor material, said regions of third semiconductor type being disposed between said regions of first semiconductor type and regions of second semiconductor type.

26. A method as claimed in claim 25 wherein said regions of a first semiconductor type are implanted or diffused with a first dopant type, said regions of a second semiconductor type are implanted or diffused with a second dopant type and said regions of third semiconductor type are without any dopant.

27. A method as claimed in claim 26 wherein said regions of third semiconductor type have a width in the range of 0.2 to 5 microns inclusive.

28. A method as claimed in claim 23, wherein said step of arranging a high impedance element further comprises using said high impedance element that includes smaller regions of first or second conductor type between larger regions of first or second semiconductor type.

29. A method as claimed in claim 23, wherein said step of arranging a high impedance element further comprises using said high impedance element that includes, for each of said first and second semiconductor structures, an even number of said regions of first semiconductor type and an odd number of said regions of second semiconductor type.

30. A method as claimed in claim 23, wherein said step of arranging a high impedance element further comprises using said high impedance element that includes a semiconductor substrate having at least one insulating layer and the continuous structure of semiconducting material on top of the insulating layer.

31. A method as claimed in claim 30, wherein said semiconductor substrate includes a conductive layer under said layer of semiconducting material.

32. A method as claimed in claim 31, wherein the conductive layer comprises a well of n-type or p-type semiconductor material in the substrate.

33. A method as claimed in claim 23, wherein said step of arranging a high impedance element further comprises using said high impedance element whose semiconductor material comprises polysilicon.

34. A method as claimed in claim 23, wherein said step of arranging a high impedance element further comprises using said high impedance element that includes at least one additional separate layer of semiconductor material on a substrate, said additional layer or layers of semiconductor material including at least one region of said first semiconductor type and at least one region of said second semiconductor type, said first and second regions being arranged alternately, said high impedance element including an electrical contact between each layer of semiconductor material.

* * * * *